United States Patent
Ukai et al.

(10) Patent No.: US 11,923,017 B2
(45) Date of Patent: Mar. 5, 2024

(54) NON-VOLATILE STORAGE DEVICE

(71) Applicant: Rohm Co., Ltd., Kyoto (JP)

(72) Inventors: Kazuhisa Ukai, Kyoto (JP); Koji Nigoriike, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 165 days.

(21) Appl. No.: 17/619,361

(22) PCT Filed: Jun. 15, 2020

(86) PCT No.: PCT/JP2020/023325
§ 371 (c)(1),
(2) Date: Dec. 15, 2021

(87) PCT Pub. No.: WO2021/002176
PCT Pub. Date: Jan. 7, 2021

(65) Prior Publication Data
US 2022/0246223 A1    Aug. 4, 2022

(30) Foreign Application Priority Data
Jul. 2, 2019    (JP) .................................. 2019-124022

(51) Int. Cl.
*G11C 16/34*    (2006.01)
*G11C 7/06*    (2006.01)
*G11C 7/16*    (2006.01)
*G11C 16/14*    (2006.01)
*G11C 16/26*    (2006.01)
*G11C 16/30*    (2006.01)

(52) U.S. Cl.
CPC ............ *G11C 16/3445* (2013.01); *G11C 7/06* (2013.01); *G11C 7/16* (2013.01); *G11C 16/14* (2013.01); *G11C 16/26* (2013.01); *G11C 16/30* (2013.01)

(58) Field of Classification Search
CPC ......... G11C 16/3445; G11C 7/06; G11C 7/16; G11C 16/14; G11C 16/26; G11C 16/30
USPC ..................................................... 365/185.22
See application file for complete search history.

(56) References Cited

U.S. PATENT DOCUMENTS

| | | | |
|---|---|---|---|
| 5,184,162 A | 2/1993 | Saitoh et al. | |
| 5,436,558 A | 7/1995 | Saitoh et al. | |
| 5,896,318 A | 4/1999 | Asada et al. | |
| 6,032,221 A | 2/2000 | Hongo | |

(Continued)

FOREIGN PATENT DOCUMENTS

| | | |
|---|---|---|
| JP | H02-105393 | 4/1990 |
| JP | H04-102080 | 4/1992 |

(Continued)

OTHER PUBLICATIONS

International Search Report in International Appln. No. PCT/JP2020/023325, dated Sep. 15, 2020, 4 pages (with English Translation).

*Primary Examiner* — Huan Hoang
(74) *Attorney, Agent, or Firm* — Fish & Richardson P.C.

(57) ABSTRACT

A non-volatile storage device includes a memory that stores data in a non-volatile manner, a power supply that generates an internal voltage to feed it to the memory, a controller that controls the memory and the power supply, an A/D converter that performs A/D conversion on the internal voltage, and a fault detector that detects a fault related to data written in the memory based on the output of the A/D converter.

18 Claims, 8 Drawing Sheets

(56) References Cited

U.S. PATENT DOCUMENTS 6,131,073 A * 10/2000 Honda .................... G01R 1/44
 330/272
2007/0030747 A1 2/2007 Hirai et al.

FOREIGN PATENT DOCUMENTS

| | | |
|---|---|---|
| JP | H08-297987 | 11/1996 |
| JP | H09139094 | 5/1997 |
| JP | H10-112192 | 4/1998 |
| JP | H10293998 | 11/1998 |
| JP | H11-134317 | 5/1999 |
| JP | 2001266599 | 9/2001 |
| JP | 2002-343868 | 11/2002 |
| JP | 2007-048347 | 2/2007 |
| WO | WO-2007134301 A2 * 11/2007 ......... G11C 11/5628 |

* cited by examiner

NON-VOLATILE STORAGE DEVICE

CROSS REFERENCE OF RELATED APPLICATIONS

This application is a U.S. National Phase application under 35 U.S.C. § 371 of International Patent Application No. PCT/JP2020/023325, filed on Jun. 15, 2020, which claims the priority of Japanese Patent Application No. JP 2019-124022, filed on Jul. 2, 2019, the disclosure of which is incorporated herein by reference in its entirety.

TECHNICAL FIELD

The invention disclosed herein relates to a non-volatile storage device.

BACKGROUND ART

A non-volatile storage device stores, for example, trimming data, function setting data, software code data, and traceability data.

LIST OF CITATIONS

Patent Literature

Patent Document 1: JP-A-2007-48347 (Paragraph 0053)

SUMMARY OF THE INVENTION

Problem to be Solved by the Invention

If data that is supposed to be stored in a non-volatile storage device is lost, semiconductor integrated circuit devices that operate using the data stored in the non-volatile storage device do not operate normally.

Where the non-volatile storage device is a rewritable storage device, if data is not properly rewritten, semiconductor integrated circuit devices that operate using the data stored in the non-volatile storage device do not operate normally after data updating (after data rewriting).

According to Patent Document 1, data loss is prevented by executing a refresh of the rewritable non-volatile storage device. In Patent Document 1, the data retention time is determined statistically in advance through a test during the manufacture of the non-volatile storage device, and a refresh time is set that is sufficiently shorter than the life of the memory cell that has the shortest data retention time. The non-volatile storage device disclosed in Patent Document 1 cannot deal with irregular faults that may occur in actual use, and thus cannot be said to provide satisfactory reliability with respect to data loss prevention.

Means for Solving the Problem

According to one aspect of what is disclosed herein, a non-volatile storage device includes a memory configured to store data in a non-volatile manner, a power supply configured to generate an internal voltage to feed it to the memory, a controller configured to control the memory and the power supply, an A/D converter configured to perform A/D conversion on the internal voltage, and a fault detector configured to detect a fault related to data written in the memory based on the output of the A/D converter (a first configuration).

In the non-volatile storage device according to the first configuration described above, preferably, the memory includes a memory cell array with a plurality of memory cells arranged in an array, a decoder configured to drive the memory cell array, and a sense amplifier configured to read data from the memory cell array (a second configuration).

In the non-volatile storage device according to the first or second configuration described above, preferably, the fault detector is configured such that, when the deviation of the output of the A/D converter from a set value exceeds a predetermined range, the fault detector detects a first fault as one type of fault, and the controller is configured such that, when the fault detector detects the first fault, the controller controls the power supply based on the output of the A/D converter so as to correct the internal voltage in accordance with the deviation of the output of the A/D converter from the set value (a third configuration).

In the non-volatile storage device according to the third configuration described above, preferably, the power supply is configured to generate, as the internal voltage, a voltage used for data erasing operation in the memory, a voltage used for data writing operation in the memory, and a voltage used for data reading operation in the memory, and the A/D converter is configured to perform A/D conversion on at least the voltage used for data erasing operation in the memory and the voltage used for data writing operation in the memory (a fourth configuration).

The non-volatile storage device according to any of the first to fourth configurations described above may further include a storage configured to store data read from the memory under a first condition and a flag output circuit configured to output a predetermined flag. Preferably, the fault detector is configured such that it compares, with data stored in the storage, data read from the memory under second conditions where the logical values of data are more difficult to determine than under the first condition, and, when the output of the A/D converter under, of the second conditions that cause comparison to result in disagreement, the condition where the logical values of data are easiest to determine exceeds a predetermined range, the fault detector detects a second fault as another type of fault. Preferably, the flag output circuit is configured such that, when the fault detector detects the second fault, the flag output circuit outputs the predetermined flag (a fifth configuration).

The non-volatile storage device according to any of the first to fourth configurations described above may further include a storage configured to store data read from the memory under the first condition. Preferably, the fault detector is configured such that it compares, with data stored in the storage, data read from the memory under second conditions where the logical values of data are more difficult to determine than under the first condition, and, when the output of the A/D converter under, of the second conditions that cause comparison to result in disagreement, the condition where the logical values of data are easiest to determine exceeds a predetermined range, the fault detector detects a second fault as another type of fault. Preferably, the controller is configured such that, when the fault detector detects the second fault, the controller stores data stored in the storage in the memory (a sixth configuration).

In the non-volatile storage device according to the fifth or sixth configuration described above, preferably, the controller stores in the memory the output of the A/D converter under, of the second conditions that cause comparison to result in disagreement, the condition where the logical value of data is easiest to determine (a seventh configuration).

In the non-volatile storage device according to any of the fifth to seventh configurations described above, preferably, the amount of data that the storage can store is smaller than the amount of data that the memory can store (an eighth configuration).

In the non-volatile storage device according to any of the fifth to eighth configurations described above, preferably, the storage is a volatile memory (a ninth configuration).

According to another aspect of what is disclosed herein, a vehicle includes the non-volatile storage device according to any of the first to ninth configurations described above and a semiconductor integrated circuit device configured to operate using data stored in the non-volatile storage device (a tenth configuration).

Advantageous Effects of the Invention

With a non-volatile storage device disclosed herein, it is possible to enhance reliability.

DESCRIPTION OF EMBODIMENTS

First Embodiment

Figure 1:
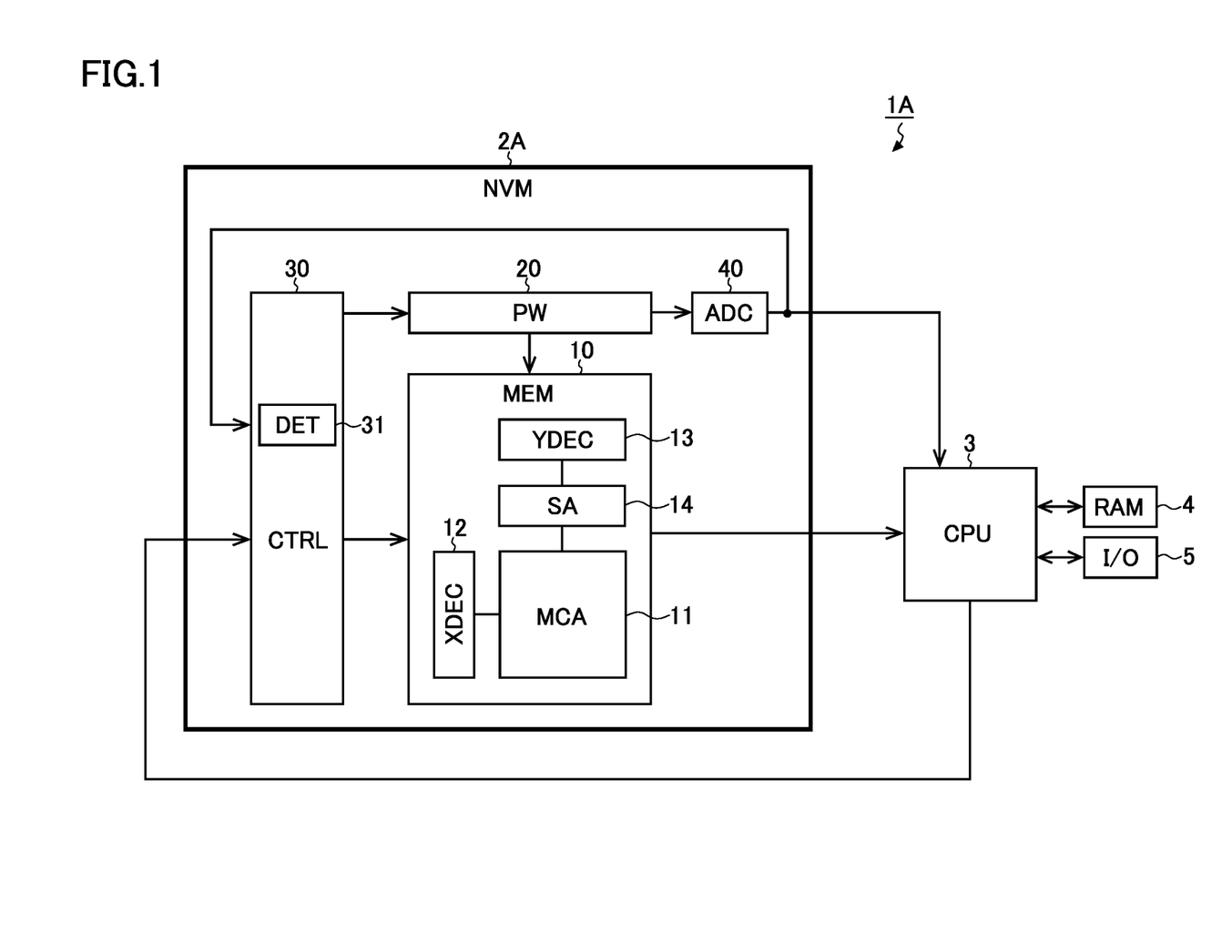
FIG. 1 is a diagram showing an outline of the configuration of a microcomputer that includes a non-volatile storage device according to a first embodiment.

FIG. 1 is a diagram showing an outline of the configuration of a microcomputer that includes a non-volatile storage device according to a first embodiment. The microcomputer 1A includes a non-volatile storage device 2A, a CPU 3, a RAM 4, and an input/output interface 5.

The non-volatile storage device 2A includes a memory 10, a power supply 20, a controller 30, and an A/D converter 40.

The memory 10 can store data in a non-volatile manner. The memory 10 includes a memory cell array 11 with a plurality of memory cells arranged in an array, an X decoder (row decoder) 12 and a Y decoder (column decoder) 13 that drive the memory cell array 11, and a sense amplifier 14 that reads data from the memory cell array 11. In this embodiment, a flash memory is used as the memory 11, though it is also possible to use, for example, an EEPROM or an FeRAM.

The power supply 20 generates internal voltages to feed them to the memory 10 and the A/D converter 40.

The controller 30 controls the memory 10 and the power supply 20. In this embodiment, the controller 30, in response to commands from the CPU 3, controls the memory 10 and the power supply 20.

Figure 2:
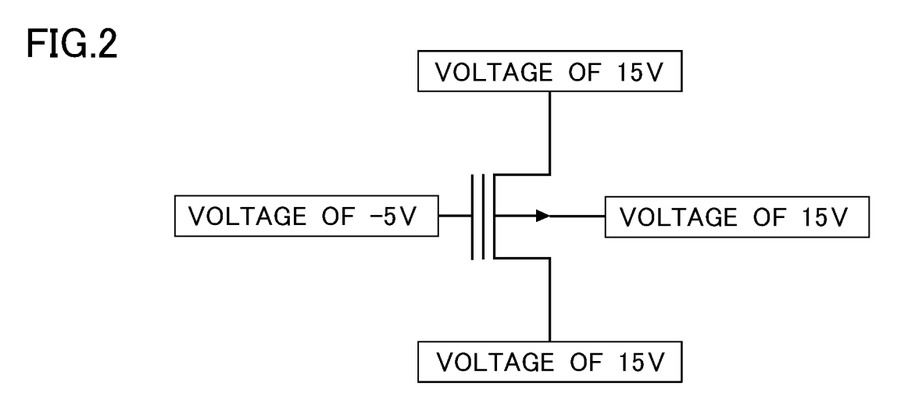
FIG. 2 is a diagram showing one example of voltages applied to memory cells during data erasing operation in a memory.

The voltages applied to the memory cells during data erasing operation in the memory 10 are, for example, as shown in FIG. 2. That is, during data erasing operation in the memory 10, the power supply 20, under the control of the controller 30, generates voltages of 15 V and −5 V as the internal voltages. Here, instead of using the voltage of 15 V from the beginning, it is also possible to first try data erasure with a voltage lower than 15 V and verify erasure and then, only for memory cells for which data erasure failed, raise the voltage level, retry data erasure, and verify erasure, repeating the procedure until no memory cells are left with data unerased.

Figure 3:
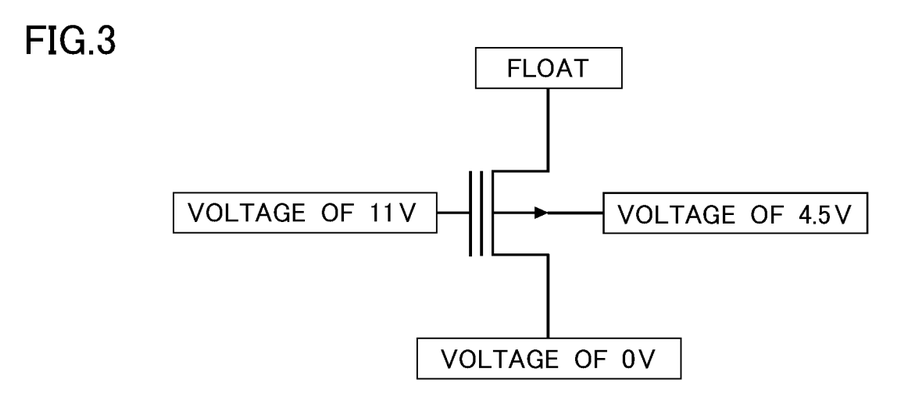
FIG. 3 is a diagram showing one example of voltages applied to the memory cells during data writing operation in the memory.

The voltages applied to the memory cells during data writing operation in the memory 10 are, for example, as shown in FIG. 3. That is, during data writing operation of the memory 10, the power supply 20, under the control of the controller 30, generates voltages of 11 V and 4.5 V as the internal voltages. Here, instead of using the voltage of 11 V from the beginning, it is also possible to first try data writing with a voltage lower than 11 V and verify data writing and then, only for memory cells for which data writing failed, raise the voltage level, retry data writing, and verify data writing, repeating the procedure until no memory cells are left with data unwritten.

Figure 4:
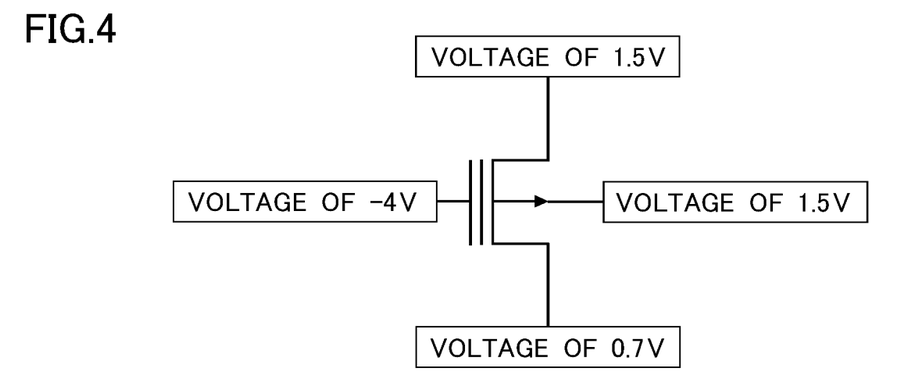
FIG. 4 is a diagram showing one example of voltages applied to the memory cells during data reading operation in the memory.

The voltages applied to the memory cells during data reading operation in the memory 10 are, for example, as shown in FIG. 4. That is, during data reading operation of the memory 10, the power supply 20, under the control of the controller 30, generates voltages of 1.5 V, 0.7 V, and −4 V as the internal voltages.

The A/D converter 40 performs A/D conversion on the internal voltages generated by the power supply 20. In this embodiment, the A/D converter 40 performs A/D conversion on the voltage (for example, the voltage of 15 V shown in FIG. 2) that is used for data erasing operation in the memory 10 and the voltage (for example, the voltage of 11 V shown in FIG. 3) that is used for data writing operation in the memory 10. In this embodiment, the output of the A/D converter 40 is fed to the CPU 3. This permits the CPU 3 to recognize a fault related to data written in the memory 10 based on the output of the A/D converter 40. In a modified version of this embodiment, the output of the A/D converter 40 does not need to be fed to outside the non-volatile storage device 2A.

A fault detector 31 included in the controller 30 detects a fault related to data written in the memory 10 based on the output of the A/D converter 40. Owing to the fault detector 31 detecting a fault related to data written in the memory 10, it is possible to take an appropriate measure (correction of the internal voltages in this embodiment) according to the detection result. This helps give the non-volatile storage device 2A enhanced reliability. In a modified version of this embodiment, the fault detector 31 may be provided outside the controller 30.

When the A/D converter 40 performs A/D conversion on the voltage used for data erasing operation in the memory 10, if the deviation of the output of the A/D converter 40 from the set value (for example, a digital value corresponding to 15 V shown in FIG. 2) for data erasing operation exceeds a predetermined range (for example, if the internal voltage corresponding to the output of the A/D converter 40 falls to or below 14.5 V), the fault detector 31 detects a state (fault) in which insufficient data erasure can occur. When the fault detector 31 detects a state (fault) in which insufficient data erasure can occur, the controller 30 controls the power supply 20 based on the output of the A/D converter 40 so as to correct the voltage used for data erasing operation in the memory 10 in accordance with the deviation of the output of the A/D converter 40 from the set value.

When the A/D converter 40 performs A/D conversion on the voltage used for data writing operation in the memory 10, if the deviation of the output of the A/D converter 40 from the set value (for example, a digital value corresponding to 11 V shown in FIG. 3) for data writing operation exceeds a predetermined range (for example, if the internal voltage corresponding to the output of the A/D converter 40 falls to or below 10.5 V), the fault detector 31 detects a state (fault) in which insufficient data writing can occur. When the fault detector 31 detects a state (fault) in which insufficient data writing can occur, the controller 30 controls the power supply 20 based on the output of the A/D converter 40 so as to correct the voltage used for data writing operation in the memory 10 in accordance with the deviation of the output of the A/D converter 40 from the set value.

There is no particular limitation on the voltage correction method in the controller 30. For example, when, as described above, the controller 30 has a function of increasing stepwise the voltage used for data erasing operation and the voltage used for data writing operation, the correction of the voltages can be achieved by replacing the step to which the controller 30 allocates the maximum value of each voltage with another step.

Figure 5:
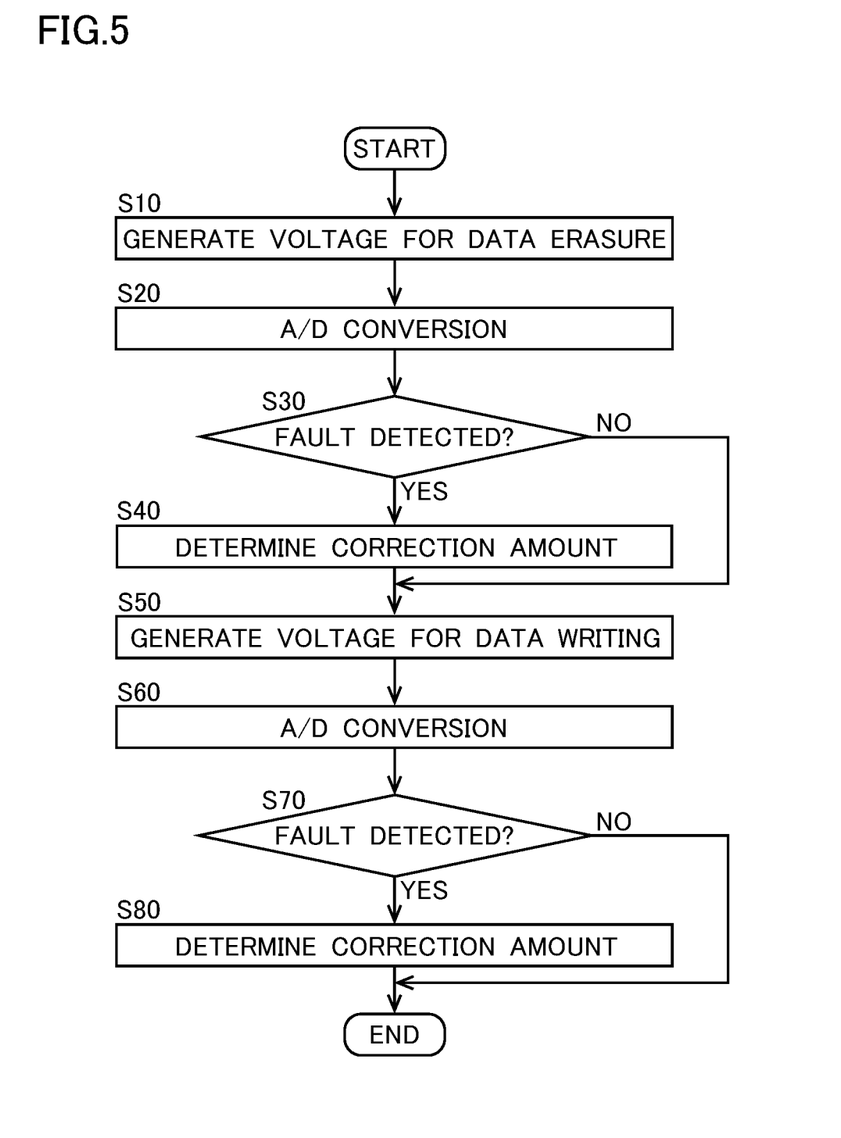
FIG. 5 is a flow chart showing an example of operation related to fault detection in the non-volatile storage device according to the first embodiment.

FIG. 5 is a flow chart showing an example of operation related to fault detection in the non-volatile storage device 2A. The procedure shown in FIG. 5 may start, for example, periodically or, if the microcomputer 1A is mounted in a vehicle, for example, when the ignition power is off.

First, the power supply 20 generates a voltage used for data erasing operation of the memory 10 (step S10). Next, the A/D converter 40 performs A/D conversion on the voltage used for data erasing operation in the memory 10 (step S20).

Next, the fault detector 31 tries detecting a fault based on the output of the A/D converter 40 (step S30).

If the fault detector 31 detects a fault (YES in step S30), the controller 30 determines a correction amount for the voltage used for data erasing operation in the memory 10 in accordance with the deviation of the output of the A/D converter 40 from the set value (step S40). On completion of step S40, the procedure proceeds to step S50.

On the other hand, if the fault detector 31 detects no fault (No in step S30), the procedure proceeds to step S50 without going through step S40.

In step S50, the power supply 20 generates a voltage used for data writing operation in the memory 10. Next, the A/D converter 40 performs A/D conversion on the voltage used for data writing operation in the memory 10 (step S60).

Next, the fault detector 31 tries detecting a fault based on the output of the A/D converter 40 (step S70).

If the fault detector 31 detects a fault (YES in step S70), the controller 30 determines a correction amount for the voltage used for data writing operation in the memory 10 in accordance with the deviation of the output of the A/D converter 40 from the set value (step S80). On completion of step S80, the procedure is finished.

On the other hand, if the fault detector 31 detects no fault (No in step S70), the procedure is finished without going through step S80.

Second Embodiment

Figure 6:
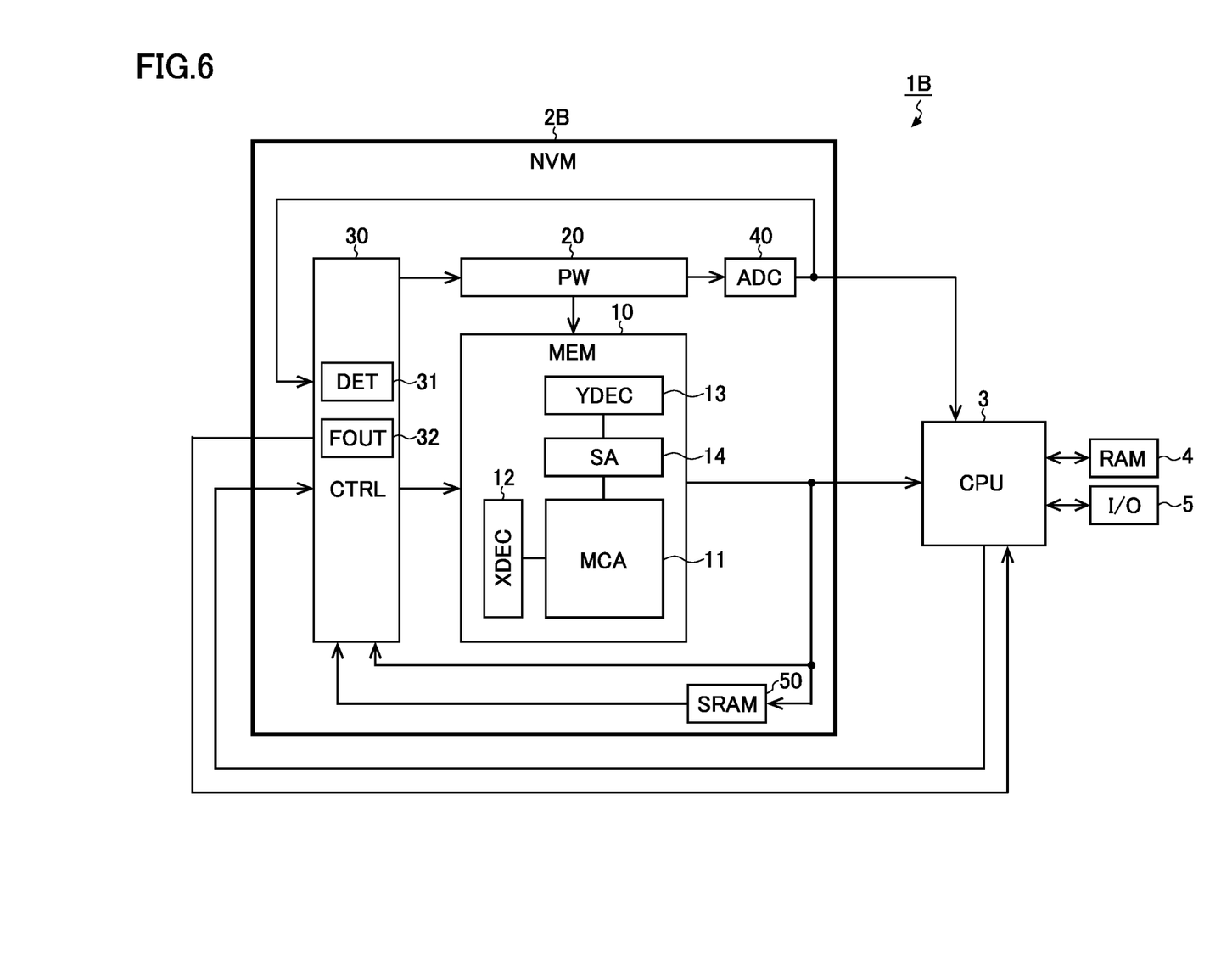
FIG. 6 is a diagram showing an outline of the configuration of a microcomputer that includes a non-volatile storage device according to a second embodiment.

FIG. 6 is a diagram showing an outline of the configuration of a microcomputer that includes a non-volatile storage device according to a second embodiment. In FIG. 6, such parts as find their counterparts in FIG. 1 are identified by the same reference signs. The microcomputer 1B includes a non-volatile storage device 2B, a CPU 3, a RAM 4, and an input/output interface 5. Such features of this embodiment as are shared with the first embodiment are, unless necessary, omitted from description, and the following description focuses on differences from the first embodiment.

The non-volatile storage device 2B includes a memory 10, a power supply 20, a controller 30, an A/D converter 40, and an SRAM 50.

In this embodiment, the A/D converter 40 performs A/D conversion on the voltage applied to the gates of the memory cells during data reading operation in the memory 10.

The SRAM 50 stores data that is read from the memory 10 under a first condition. Instead of the SRAM 10, any memory other than an SRAM may be used. The first condition is a condition for ordinary data reading, and is, for example, a condition where voltages are applied as shown in FIG. 4.

From the perspective of reducing the size and cost of the non-volatile storage device 2B, it is preferable that the amount of data that the SRAM 50 can store be smaller than the amount of data that the memory 10 can store. When the data amount that the SRAM 50 can store is smaller than the data amount that the memory 10 can store, data reading from the memory 10, data storing in the SRAM 50, and data comparison, which will be described later, need each to be performed in more than one session. In contrast, if the data amount that the SRAM 50 can store is equal to the data amount that the memory 10 can store, data reading from the memory 10, data storing in the SRAM 50, and data comparison, which will be described later, can each be performed in one session.

The fault detector 31 included in the controller 30 detects a fault related to data written in the memory 10 based on the output of the A/D converter 40. Owing to the fault detector 31 detecting a fault related to data written in the memory 10, it is possible to take an appropriate measure (in this embodiment, output of a flag indicating a high risk of data loss) according to the detection result. This helps give the non-volatile storage device 2B enhanced reliability. In a modified version of this embodiment, the fault detector 31 may be provided outside the controller 30.

The fault detector 31 compares, with data stored in the SRAM 50, data that is read from the memory 10 under second conditions where the logical values of data are more difficult to determine than under the first condition (for example, a condition where the voltage applied to the gates of the memory cells is higher than in the first condition), and, if the output of the A/D converter 40 under, of the second conditions that cause the comparison to result in disagreement, the condition where the logical values of data are easiest to determine exceeds a predetermined range (for example, if the internal voltage that corresponds to the output of the A/D converter 40 is higher than −4 V but equals to or smaller than −3.5 V), the fault detector 31 detects a state (fault) in which there is a high risk of data loss.

The controller 30 stores in the memory 10 the output of the A/D converter 40 under, of the second conditions that cause the comparison to result in disagreement, the condition where the logical values of data are easiest to determine. This makes it possible to analyze or verify how the risk of data loss increases before the fault detector 31 detects a state (fault) involving a high risk of data loss.

When the fault detector 31 detects a state (fault) involving a high risk of data loss, a flag output circuit 32 included in the controller 30 outputs a predetermined flag (a flag indicating a high risk of data loss) to outside the non-volatile storage device 2B (to the CPU 3 in this embodiment). This makes it possible to stop the operation of the microcomputer 1B before it goes out of normal operation or to notify a user of the fault. In a modified version of this embodiment, the flag output circuit 32 may be provided outside the controller 30.

Figure 7:
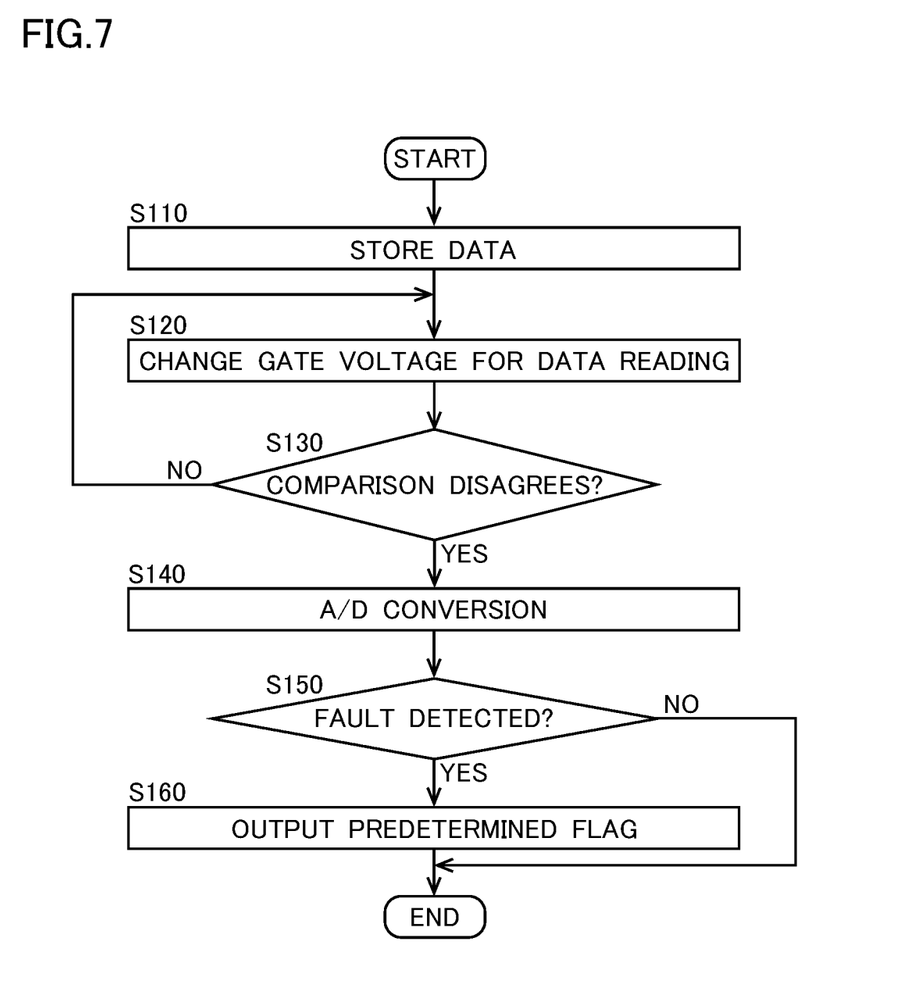
FIG. 7 is a flow chart showing an example of operation related to fault detection in the non-volatile storage device according to the second embodiment.

FIG. 7 is a flow chart showing an example of operation related to fault detection in the non-volatile storage device 2B. The procedure shown in FIG. 7 may start, for example, periodically or, if the microcomputer 1B is mounted in a vehicle, for example, when the ignition power is off.

First, the SRAM 50 stores data that is read from the memory 10 under the first condition (step S110). Next, the controller 30 increases the voltages applied to the memory cells during data reading operation in the memory 10 (step S120). In this way, after step S120, data is read from the memory 10 under the second condition. As the number of time that step S120 is performed increases, the voltage applied to the gates of the memory cells during data reading operation in the memory 10 increases.

Next, the fault detector 31 compares, with data stored in the SRAM 50, data that is read from the memory 10 under the second condition and judges whether the comparison results in disagreement (step S130).

If the comparison results in agreement (No in step S130), the procedure returns to step S120.

On the other hand, if the comparison results in disagreement (YES in step S130), the A/D converter 40 performs A/D conversion on the voltage applied to the gates of the memory cells during data reading operation in the memory 10 (step S140). Next, the fault detector 31 tries detecting a fault based on the output of the A/D converter 40 (step S150).

If the fault detector 31 detects a fault (Yes in step S150), the flag output circuit 32 outputs a predetermined flag (step S160). On completion of step S160, the procedure is finished.

On the other hand, if the fault detector 31 detects no fault (No in step S150), the procedure is finished without going through step S160.

In the procedure shown in FIG. 7, the voltage applied to the gates of the memory cells during data reading operation in the memory 10 can increase infinitely until the comparison results in disagreement. In a modified version of this operation, an upper limit may be set with respect to the voltage applied to the gates of the memory cells during data reading operation in the memory 10, and, if, when the voltage applied to the gates of the memory cells during data reading operation in the memory 10 reaches the upper limit, the comparison still results in agreement, the procedure may be finished without the flag output circuit 32 outputting a predetermined flag.

Third Embodiment

Figure 8:
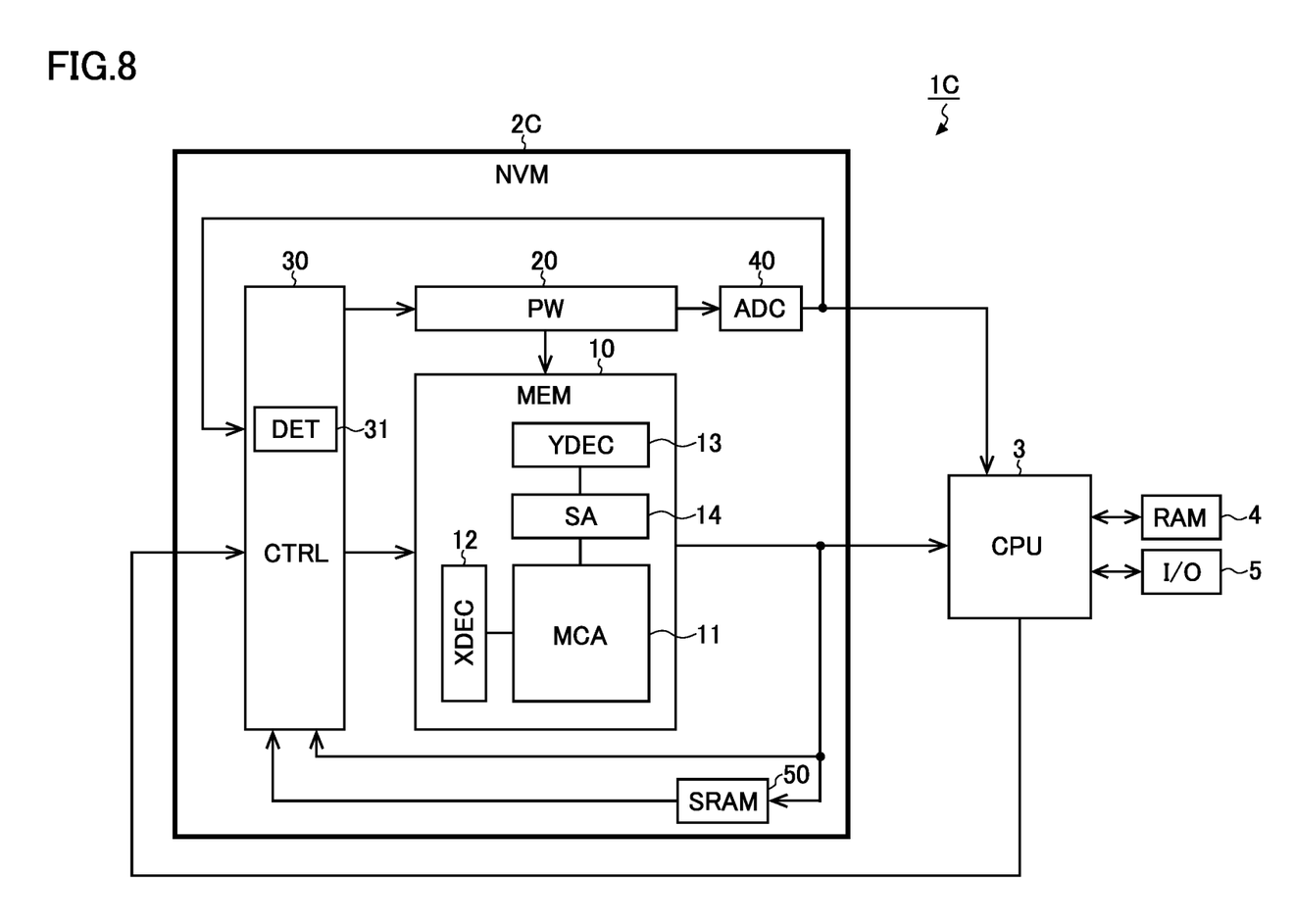
FIG. 8 is a diagram showing an outline of the configuration of a microcomputer that includes a non-volatile storage device according to a third embodiment.

FIG. 8 is a diagram showing an outline of the configuration of a microcomputer that includes a non-volatile storage device according to a third embodiment. In FIG. 8, such parts as find their counterparts in FIG. 6 are identified by the same reference signs. The microcomputer 1C includes a non-volatile storage device 2C, a CPU 3, a RAM 4, and an input/output interface 5. Such features of this embodiment as are shared with the second embodiment are, unless necessary, omitted from description, and the following description focuses on differences from the second embodiment.

The non-volatile storage device 2C includes a memory 10, a power supply 20, a controller 30, an A/D converter 40, and an SRAM 50. The non-volatile storage device 2C is different from the non-volatile storage device 2B in that it does not include the flag output circuit 32.

When the fault detector 31 detects a state (fault) involving a high risk of data loss, the controller 30 stores the data stored in the SRAM 50 in an area in the memory 10 in which the data is written. Specifically, when the fault detector 31 detects a state (fault) involving a high risk of data loss, the memory 10, under the control of the controller 30, erases the data in the area in the memory 10 in which the data stored in the SRAM 50 is written, and then rewrites the data stored in the SRAM 50 to the area in the memory 10 where the data stored in the SRAM 50 has been stored up to then. This helps change the state (fault) involving a high risk of data loss to a state (normal state) involving a low risk of data loss.

Figure 9:
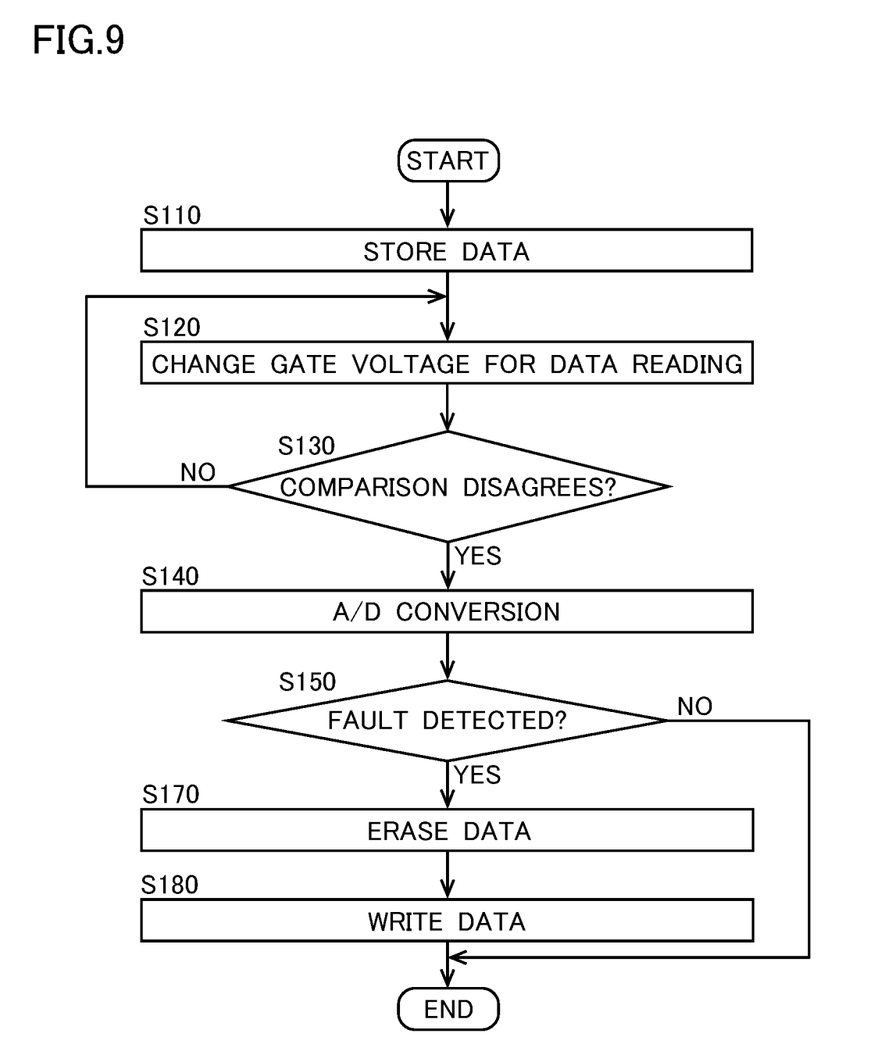
FIG. 9 is a flow chart showing an example of operation related to fault detection in the non-volatile storage device according to the third embodiment.

FIG. 9 is a flow chart showing an example of operation related to fault detection in the non-volatile storage device 2C. The procedure shown in FIG. 9 may start, for example, periodically or, if the microcomputer 1C is mounted in a vehicle, for example, when the ignition power is off.

The procedure shown in FIG. 9 is similar to that shown in FIG. 7 except that step S160 is replaced with steps S170 and S180. Accordingly, steps S110 to S150 are omitted from description.

In step S170, the memory 10, under the control of the controller 30, erases the data in the area in the memory 10 in which data stored in the SRAM 50 is written.

Subsequent to step S170, in step S180, the memory 10, under the control of the controller 30, rewrites the data stored in the SRAM 50 to the area in the memory 10 in which data stored in the SRAM 50 has been written up to then.

Applications

Figure 10:
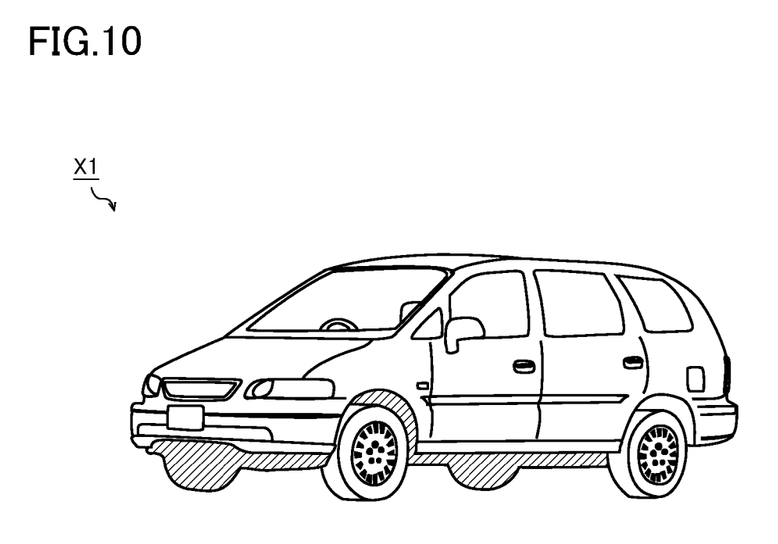
FIG. 10 is an exterior view of a vehicle.

The microcomputers 1A and 1C are used, for example, as components of various kinds of ECUs mounted in a vehicle X1 as shown in FIG. 10. While, in the embodiments described above, the CPU 3 operates using data stored in the non-volatile storage devices 2A to 2C, a semiconductor integrated circuit device that operates using data stored in the non-volatile storage devices 2A to 2C is not limited to a CPU. That is, the non-volatile storage devices 2A to 2C may be used in devices other than microcomputers.

Notes

The various technical features disclosed herein can be implemented in any manners other than as described in connection with an embodiment above with various modifications made within the sense of their technical ingenuity. That is, the above embodiments should be understood to be in every aspect illustrative and not restrictive. The scope of the present invention is defined not by the description of the embodiments given above but by the appended claims, and should be understood to encompass any modifications made in a sense and scope equivalent to those of the claims.

For example, the first and second embodiments described above can be implemented in combination.

For example, the first and third embodiments described above can be implemented in combination.

For example, the first embodiment described above can be configured such that the A/D converter 40 performs A/D conversion also on the voltage used for data reading operation in the memory 10, and that the fault detector 31 detects also a fault related to data reading.

LIST OF REFERENCE SIGNS 1A, 1B, 1C microcomputer
2A, 2B, 1C non-volatile storage device
10 memory
11 memory cell array
12 X decoder
13 Y decoder
14 sense amplifier
20 power supply
30 controller
31 fault detector
32 flag output circuit
40 A/D converter
X1 vehicle

The invention claimed is:

1. A non-volatile storage device comprising:
a memory configured to store data in a non-volatile manner;
an A/D converter;
a power supply configured to generate an internal voltage to feed the internal voltage to the memory and to the A/D converter;
a controller configured to control the memory and the power supply; and
a fault detector configured to detect a fault related to data written in the memory based on an output of the A/D converter,
wherein the A/D converter is configured to perform A/D conversion on the internal voltage fed from the power supply to the A/D converter directly without passing through the memory.

2. The non-volatile storage device according to claim 1, wherein the memory includes
a memory cell array with a plurality of memory cells arranged in an array,
a decoder configured to drive the memory cell array, and
a sense amplifier configured to read data from the memory cell array.

3. The non-volatile storage device according to claim 1, wherein
the fault detector is configured such that, when a deviation of the output of the A/D converter from a set value exceeds a predetermined range, the fault detector detects a first fault as one type of the fault, and
the controller is configured such that, when the fault detector detects the first fault, the controller controls the power supply based on the output of the A/D converter so as to correct the internal voltage in accordance with the deviation of the output of the A/D converter from the set value.

4. The non-volatile storage device according to claim 3, wherein
the power supply is configured to generate, as the internal voltage, a voltage used for data erasing operation in the memory, a voltage used for data writing operation in the memory, and a voltage used for data reading operation in the memory, and
the A/D converter is configured to perform A/D conversion on at least the voltage used for data erasing operation in the memory and the voltage used for data writing operation in the memory.

5. The non-volatile storage device according to claim 1, further comprising:
a storage configured to store data read from the memory under a first condition; and
a flag output circuit configured to output a predetermined flag,
wherein
the fault detector is configured such that it compares, with data stored in the storage, data read from the memory under second conditions where logical values of data are more difficult to determine than under the first condition, and, when the output of the A/D converter under, of the second conditions that cause comparison to result in disagreement, the condition where the logical values of data are easiest to determine exceeds a predetermined range, the fault detector detects a second fault as another type of the fault, and
the flag output circuit is configured such that, when the fault detector detects the second fault, the flag output circuit outputs the predetermined flag.

6. The non-volatile storage device according to claim 5, wherein the controller stores in the memory the output of the A/D converter under, of the second conditions that cause comparison to result in disagreement, the condition where the logical value of data is easiest to determine.

7. The non-volatile storage device according to claim 5, wherein an amount of data that the storage can store is smaller than an amount of data that the memory can store.

8. The non-volatile storage device according to claim 5, wherein the storage is a volatile memory.

9. The non-volatile storage device according to claim 1, further comprising a storage configured to store data read from the memory under a first condition,
wherein
the fault detector is configured such that it compares, with data stored in the storage, data read from the memory under second conditions where logical values of data are more difficult to determine than under the first condition, and, when the output of the A/D converter under, of the second conditions that cause comparison to result in disagreement, the condition where the logical values of data are easiest to determine exceeds a predetermined range, the fault detector detects a second fault as another type of the fault, and
the controller is configured such that, when the fault detector detects the second fault, the controller stores data stored in the storage in the memory.

10. A vehicle comprising:
the non-volatile storage device according to claim 1; and
a semiconductor integrated circuit device configured to operate using data stored in the non-volatile storage device.

11. A non-volatile storage device comprising:
a memory configured to store data in a non-volatile manner;
a power supply configured to generate an internal voltage to feed the internal voltage to the memory;
a controller configured to control the memory and the power supply;

an A/D converter configured to perform A/D conversion on the internal voltage; and a fault detector configured to detect a fault related to data written in the memory based on an output of the A/D converter, wherein the fault detector is configured such that, when a deviation of the output of the A/D converter from a set value exceeds a predetermined range, the fault detector detects a first fault as one type of the fault, and the controller is configured such that, when the fault detector detects the first fault, the controller controls the power supply based on the output of the A/D converter so as to correct the internal voltage in accordance with the deviation of the output of the A/D converter from the set value.

12. The non-volatile storage device according to claim 11, wherein the power supply is configured to generate, as the internal voltage, a voltage used for data erasing operation in the memory, a voltage used for data writing operation in the memory, and a voltage used for data reading operation in the memory, and the A/D converter is configured to perform A/D conversion on at least the voltage used for data erasing operation in the memory and the voltage used for data writing operation in the memory.

13. A vehicle comprising:

the non-volatile storage device according to claim 11; and a semiconductor integrated circuit device configured to operate using data stored in the non-volatile storage device.

14. A non-volatile storage device comprising:

a memory configured to store data in a non-volatile manner;

a power supply configured to generate an internal voltage to feed the internal voltage to the memory;

a controller configured to control the memory and the power supply;

an A/D converter configured to perform A/D conversion on the internal voltage;

a fault detector configured to detect a fault related to data written in the memory based on an output of the A/D converter;

a storage configured to store data read from the memory under a first condition; and a flag output circuit configured to output a predetermined flag, wherein:

the fault detector is configured such that it compares, with data stored in the storage, data read from the memory under second conditions where logical values of data are more difficult to determine than under the first condition, and, when the output of the A/D converter under, of the second conditions that cause comparison to result in disagreement, the condition where the logical values of data are easiest to determine exceeds a predetermined range, the fault detector detects a second fault as another type of the fault, and the flag output circuit is configured such that, when the fault detector detects the second fault, the flag output circuit outputs the predetermined flag.

15. The non-volatile storage device according to claim 14, wherein the controller stores in the memory the output of the A/D converter under, of the second conditions that cause comparison to result in disagreement, the condition where the logical value of data is easiest to determine.

16. The non-volatile storage device according to claim 14, wherein an amount of data that the storage can store is smaller than an amount of data that the memory can store.

17. The non-volatile storage device according to claim 14, wherein the storage is a volatile memory.

18. A vehicle comprising:

the non-volatile storage device according to claim 14; and a semiconductor integrated circuit device configured to operate using data stored in the non-volatile storage device.

* * * * *